(12) United States Patent
Yunker et al.

(10) Patent No.: US 8,659,426 B2
(45) Date of Patent: Feb. 25, 2014

(54) RETAIL SECURITY DISPLAY SYSTEM

(75) Inventors: Geoff Yunker, Vero Beach, FL (US); Walter V. Raczynski, V, Arlington Heights, IL (US); Charles L. Zimnicki, Lake Zurich, IL (US)

(73) Assignees: Tracthat LLC, Milwaukee, WI (US); Walter V. Raczynski; Charles L. Zimnicki

( * ) Notice: Subject to any disclaimer, the term of this patent is extended or adjusted under 35 U.S.C. 154(b) by 0 days.

(21) Appl. No.: 13/584,225

(22) Filed: Aug. 13, 2012

(65) Prior Publication Data

US 2013/0063266 A1    Mar. 14, 2013

Related U.S. Application Data

(60) Provisional application No. 61/523,297, filed on Aug. 13, 2011.

(51) Int. Cl.
  *G08B 13/14* (2006.01)

(52) U.S. Cl.
  USPC .................................. 340/568.1; 340/572.1

(58) Field of Classification Search
  USPC .......... 340/568.1, 572.1, 568.8; 248/417, 551
  See application file for complete search history.

(56) References Cited

U.S. PATENT DOCUMENTS

2008/0142665 A1* 6/2008 Belden et al. ................. 248/417

* cited by examiner

*Primary Examiner* — Shirley Lu
(74) *Attorney, Agent, or Firm* — Brian G. Gilpin; Godfrey & Kahn, S.C.

(57) ABSTRACT

A retail security display system includes an onboard power supply and alarm system that sounds in the event a protected device is tampered with or removed from the display system. The retail security display system also includes a central communication module that manages information from a plurality of display devices and tracks the location of a protected device if it is removed from the display device.

20 Claims, 10 Drawing Sheets

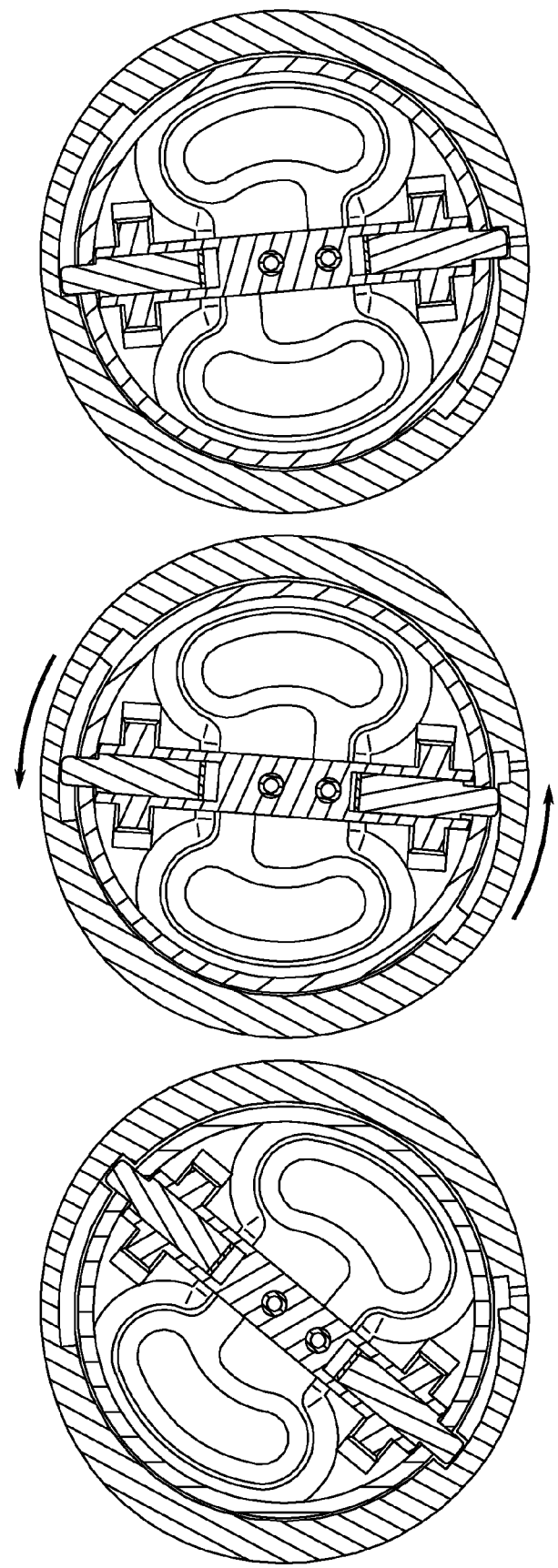

RETAIL SECURITY DISPLAY SYSTEM

CROSS-REFERENCE TO RELATED APPLICATION

This application is based on and claims priority to U.S. Provisional Patent Application No. 61/523,297 filed on Aug. 13, 2011, which is incorporated herein by reference in its entirety for all purposes.

FIELD OF THE INVENTION

The present invention relates generally to the field of retail displays. More particularly, the present invention relates to a retail display including an alarm and power source that may also collect consumer engagement data.

BACKGROUND

In the field of retail displays, there is a need to display small items, typically electronics such as cell-phones, camcorders, cameras, and computers in a way that allows consumers to manipulate the devices in the store. A security problem exists, however, because the devices are typically small and valuable, making them ideal targets for theft. One common solution to the aforementioned security problem is to anchor the device to a shelf, table, or display. Such displays typically include mechanical attachments or adhesive attachments to secure the protected device to the display surface. The displays often include a head unit that attaches to the protected device, and a base unit onto which the head unit rests when the protected device is not being held by a customer. Additionally, the displays are often configured to align the protected device in a particular orientation when the head unit is replaced on the base unit. Existing displays also may provide power to the protected device and/or alarm capabilities in the event the device is removed from the display.

The existing displays lack the ability, however, to identify to store personnel which protected device has been removed from the display, and who removed it. The existing displays also do not include the capability of communicating with the protective device.

SUMMARY

The present invention relates to a retail security display system which includes a central communication module that communicates with a plurality of retail displays. Each of the retail displays includes a base unit and a head unit. The base unit provides power from an external power supply to the head unit and to a protected device. The base unit transmits and receives information to and from the central communication module and to and from the head unit. The base unit can include a housing, a first printed circuit board, at least one battery, a first sound generation element, and at least one magnet. The head unit permanently attaches to a protected device and can include a housing, a second printed circuit board, a second sound generation element, an onboard power supply, and at least one magnet. The head unit can further include an embossed geometrical shape that aligns with a corresponding cavity on an upper surface of the base unit. The magnets in the head unit and base unit removably secure the head unit to the base unit. The head unit can further include an alarm circuit which activates the first and second sound generation elements. The alarm circuit is activated if the connection between the head unit and the base unit is severed.

It will be understood by those skilled in the art that one or more aspects of this invention can meet certain objectives, while one or more other aspects can lead to certain other objectives. Other objects, features, benefits and advantages of the present invention will be apparent in this summary and descriptions of the disclosed embodiment, and will be readily apparent to those skilled in the art. Such objects, features, benefits and advantages will be apparent from the above as taken in conjunction with the accompanying figures and all reasonable inferences to be drawn therefrom.

BRIEF DESCRIPTION OF THE DRAWINGS

FIGS. 10A-C are section views of the retail security display system of FIG. 1 taken generally along the line 10-10 in FIG. 9.

DETAILED DESCRIPTION

Figure 1:
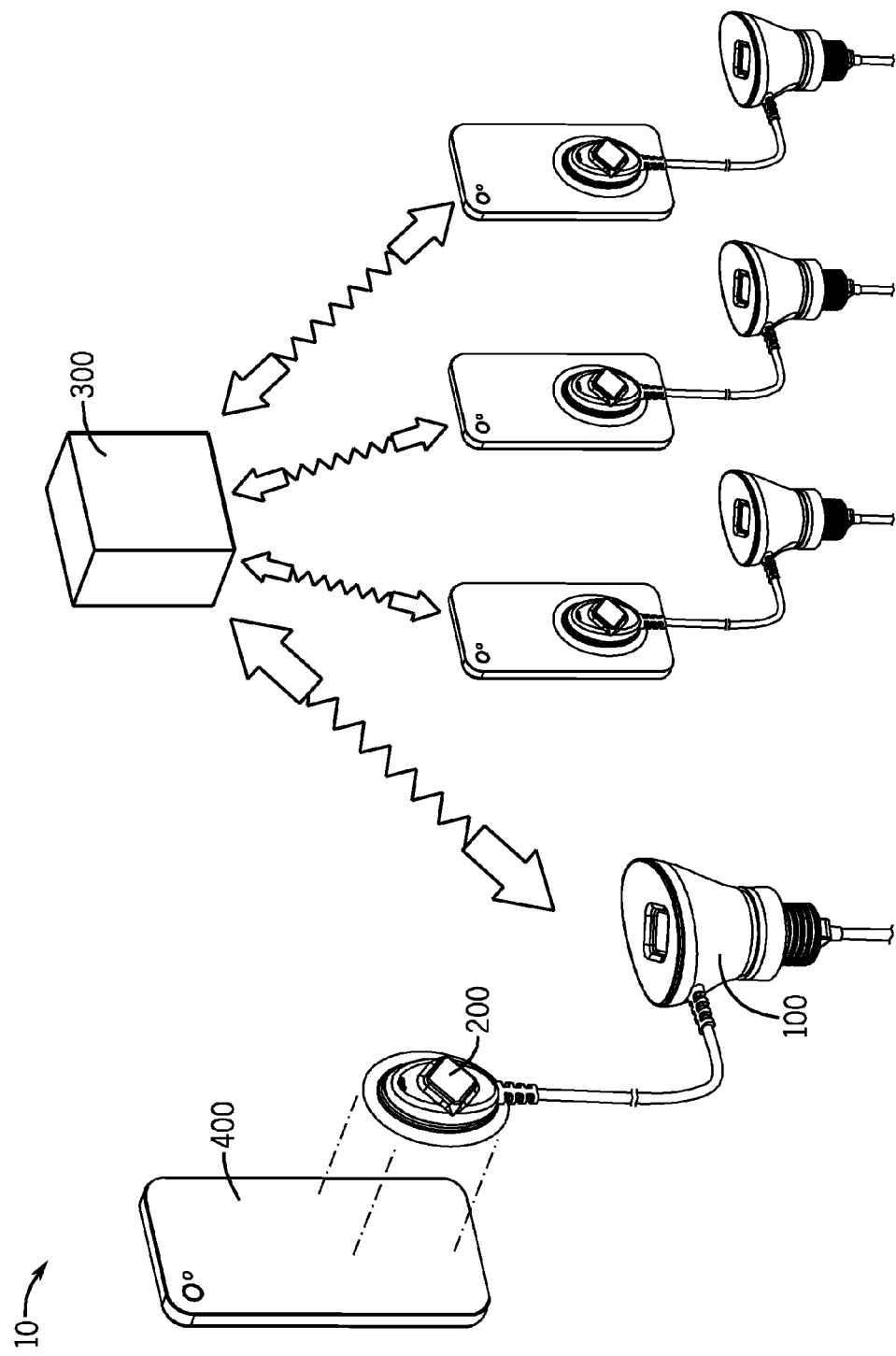
FIG. 1 is a schematic view of one embodiment of a retail security display system in accordance with one embodiment the invention.
Figure 2:
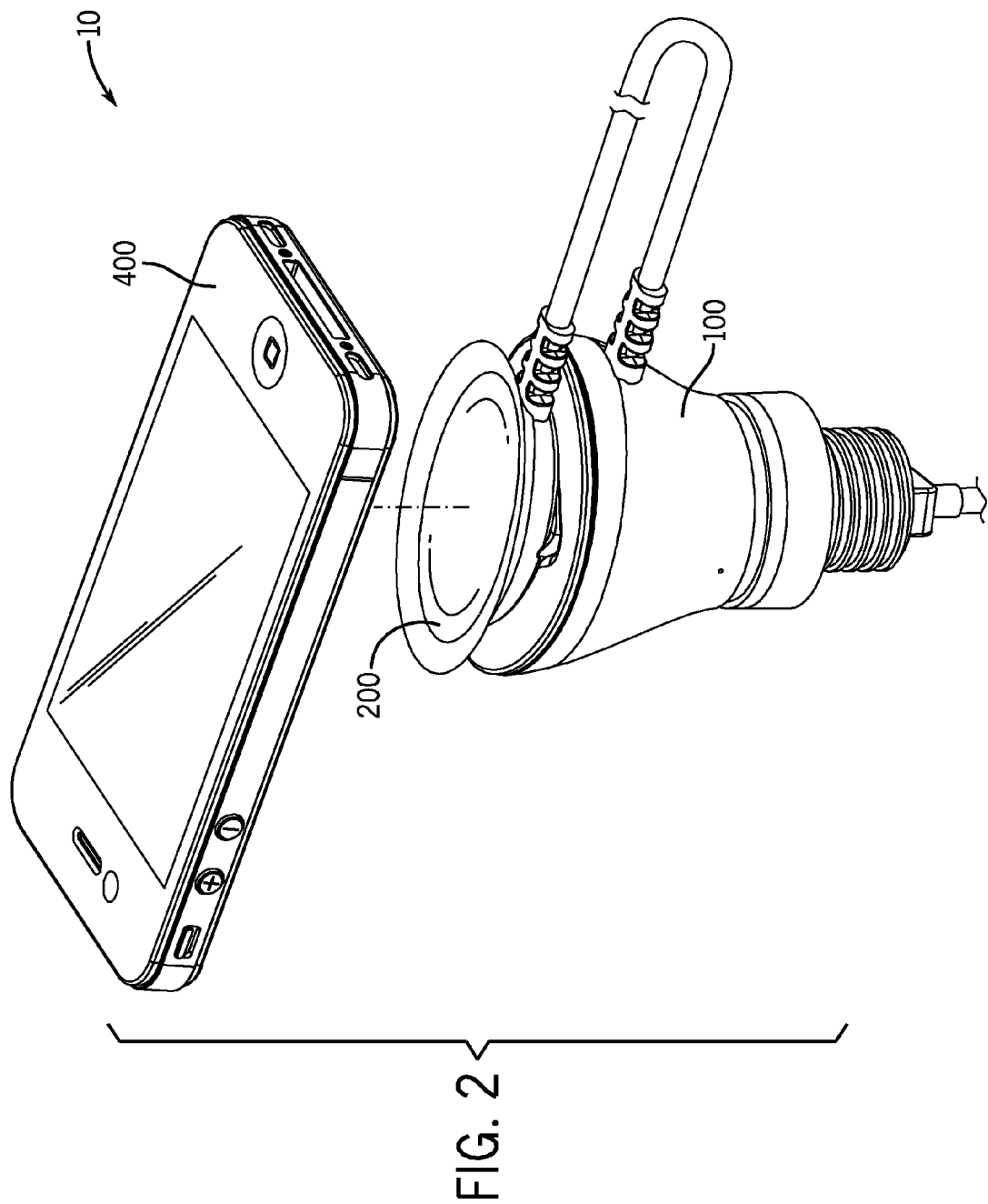
FIG. 2 is a perspective view of one base and head unit of the retail security display system of FIG. 1.

Referring to FIGS. 1-2, one embodiment of a retail security display system 10 in accordance with the invention is shown. The retail security display system 10 includes a base unit 100, a head unit 200, and a central communication module 300. The head unit 200 is attached by permanent adhesive to a protected device 400. The base unit 100 is semi-permanently attached to a display surface and is electrically connected to the head unit 200. In the embodiment shown, the base unit 100 communicates wirelessly with the central communication module 300. Of course, the base unit 100 may communicate through a wired connection with the central communication module 300 without departing from the invention.

Figure 3:
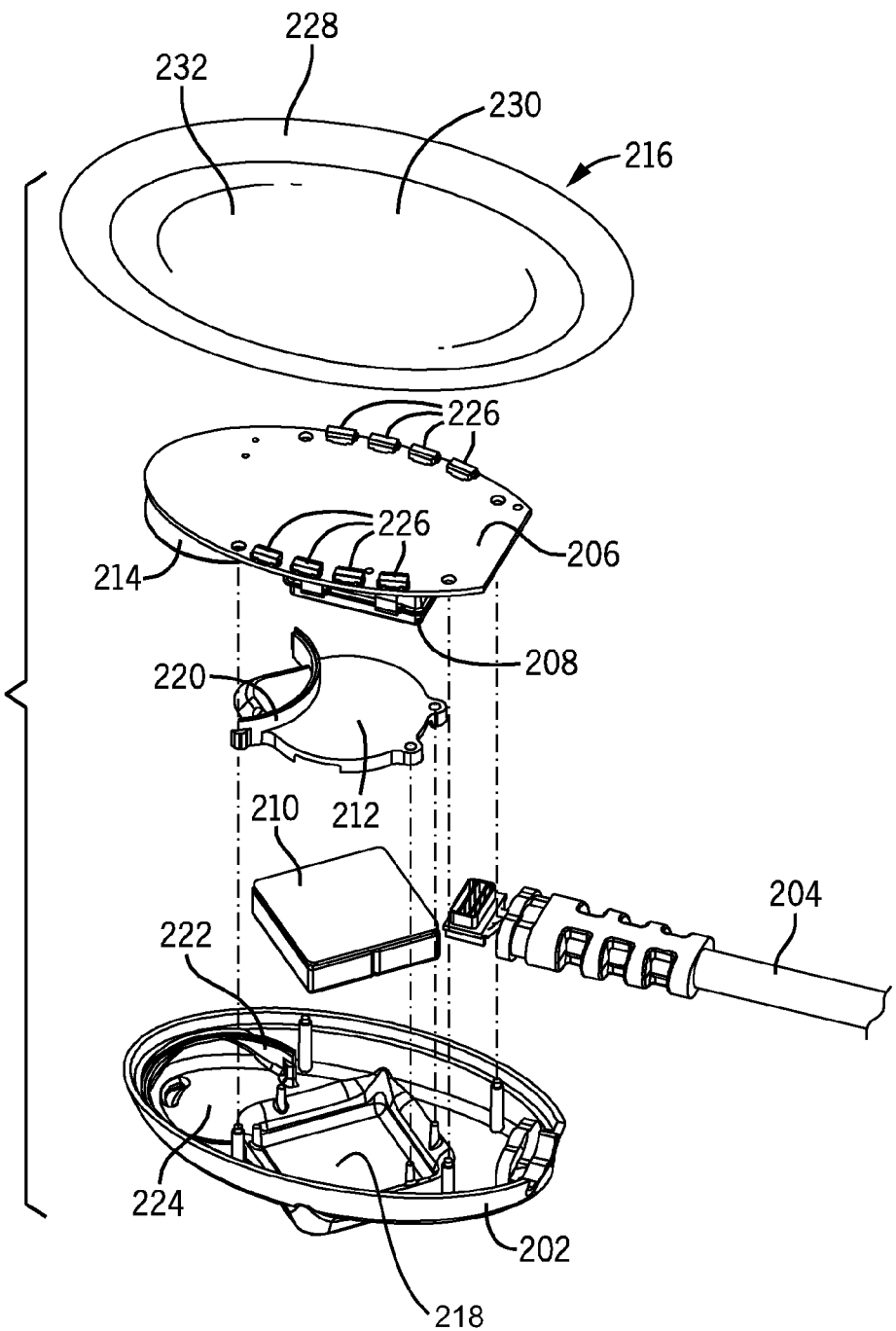
FIG. 3 is an exploded perspective view of a head unit in accordance with one embodiment of the invention.

Turning now to FIG. 3, an exploded view of the head unit 200 is shown. In this embodiment, the head unit 200 includes a housing 202, a cable 204, a first printed circuit board ("first PCB") 206, a battery 208, a plurality of magnets 210, a magnet retention clip 212, a sonic transducer 214, and a skirt 216. The cable 204 connects the head unit 200 to the base unit 100.

In the embodiment shown, the housing 202 includes a magnet cavity 218 into which the plurality of magnets 210 is installed. In the embodiment shown, the magnet cavity 218 also forms a geometric alignment protrusion 217 (see FIG. 4) that extends from the head unit 200. The plurality of magnets 210 are retained in the magnet cavity by the magnet retention clip 212. In the embodiment shown, the magnet retention clip 212 is heat staked to the housing 202. The magnet retention clip 212 may alternatively be attached to the housing 202 by ultrasonic welding, adhesive, or any other attachment means without departing from the invention. In addition to retaining the magnets 210 in the housing, the magnet retention clip 212 also includes a curved protrusion 220 that has a complementary shape to a specific curved inner portion 222 of the housing 202. The combination of the curved protrusion 220 and the curved inner portion 222 forms a resonance cavity 224 for the sonic transducer 214. The sonic transducer 214 is electrically connected to the first PCB 206, and provides operational and alarm tones. Other sound generating apparatuses may be used in place of the sonic transducer 214 without departing from the invention.

The first PCB 206 also includes a plurality of LEDs 226. The LEDs 226 illuminate to draw attention to the protected device 400, and may also be used to signal an alarm to store personnel. For example, if a thief attempts to steal the protected device 400, the LEDs 226 may flash, change colors, or otherwise draw attention to the head unit 200 and the thief. In the embodiment shown, the LEDs 226 display a plurality of colors, but single color LEDs or any other suitable light source may be used without departing from the invention. For example, the LEDs 226 may flash red when an alarm is triggered, but display blue when the alarm is simply armed. Alternatively, the LEDs 226 may display a pattern of colors to draw a customer's attention to the protected device 400.

The first PCB 206 further includes communications circuitry (not shown) that allows the head unit to communicate to the base unit 100, which in turn communicates to the central communication module 300.

The skirt 216 encloses the housing 202. In the embodiment shown, the skirt 216 permits light from the LEDs 226 to emit from the head unit 200. The skirt 216 includes an outer flange 228 that is resilient to allow the head unit to securely attach to a variety of protected devices 400. The inner portion of the skirt 230 has a metalized interior surface (not shown). High bond adhesive is applied to the exterior surface 232 of the inner portion of the skirt 230 so that when the head unit 200 is attached to the protected device 400, the two pieces are permanently bonded together. The head unit 200 may also be adhered to the protected device 400 by any other suitable means including but not limited to double sided tape or mechanical fasteners.

The metalized inner surface of the skirt cooperatively interacts with a circuit element on the first PCB 206 to form a proximity sensor. The proximity sensor detects attempts to remove the head unit 200 from the protected device 400. The interaction between the metalized inner surface of the skirt and the circuit element forms an auto-calibrated capacitive cell structure. When the head unit 200 is attached to the protected device 400, the inner surface of the skirt 230 is adhered to the protected device, and the metalized inner surface automatically calibrates the capacitive cell structure by settling on a particular frequency. If someone attempts to tamper with the head unit 200 or otherwise remove it from the protected device 400, the necessary flexing of the skirt 216 will change the frequency of the circuit and a microprocessor on the first PCB 206 will detect the change and activate the alarm.

The battery 208 included in the head unit 200 provides power to the head unit in the event that it is disconnected from the DC power supply. Such a loss of continuity between the head unit 200 and the base unit 100 will trigger the head unit alarm. The battery 208 is continuously charged by the wired connection to the base unit 100. The alarm will continue to sound as long as the battery 208 has power. Other self sustaining power sources may also be used in place of the battery 208 without departing from the invention. The inclusion of the battery 208 and alarm in the head unit 200 allows the alarm sound and illuminated LEDs 226 to travel with the protected device in the event someone tampers with or disconnects the head unit and attempts to take the protected device 400 out of the store, thereby making it easier to track the protected device.

In the embodiment shown, when the alarm is activated, the central communication module 300 activates a mobile device manager application ("MDM") present on the protected device 400. MDM's are known in the art. In the embodiment shown, the central communication module 300 utilizes the MDM to lock the protected device 400, display to the thief that he has stolen the protected device, and further prevents the protected device from being powered off so that a Global Positioning System ("GPS") circuit onboard may be used to track the location of the protected device. Of course, the central communication module 300 may use the MDM to perform any number of additional functions without departing from the invention. When the MDM is activated, the central communication module 300 uses internet based security software to display to store personnel which protected device 400 has been tampered with and will use GPS data from the protected device to locate it within the store. If the thief manages to take the protected device 400 out of the store, the internet based security software will display GPS mapping software that will track the device.

Alternatively, the first PCB 206 may include Near Field Communications circuitry ("NFC") which, if the protected device 400 is so equipped, communicates with the protected device 400 to sound the protected device's internal alarm and trigger the devices onboard security sequence protocol in the event of a loss of continuity between the head unit 200 and the base unit 100. Additionally, once the internal alarm on the protected device 400 is activated, a internet based security software will display which protected device 400 has been tampered with and, if available, will use GPS data from the protected device to locate it within the store. If the thief manages to take the protected device 400 out of the store, the internet based security software will display GPS mapping software that will track the device. Of course, the retail security display system 10 may communicate with the protected device 400 by other communication means, be they wired or wireless. Additionally, the head unit 200 may include a GPS chipset in the event the protected device 400 does not have one.

Figure 4:
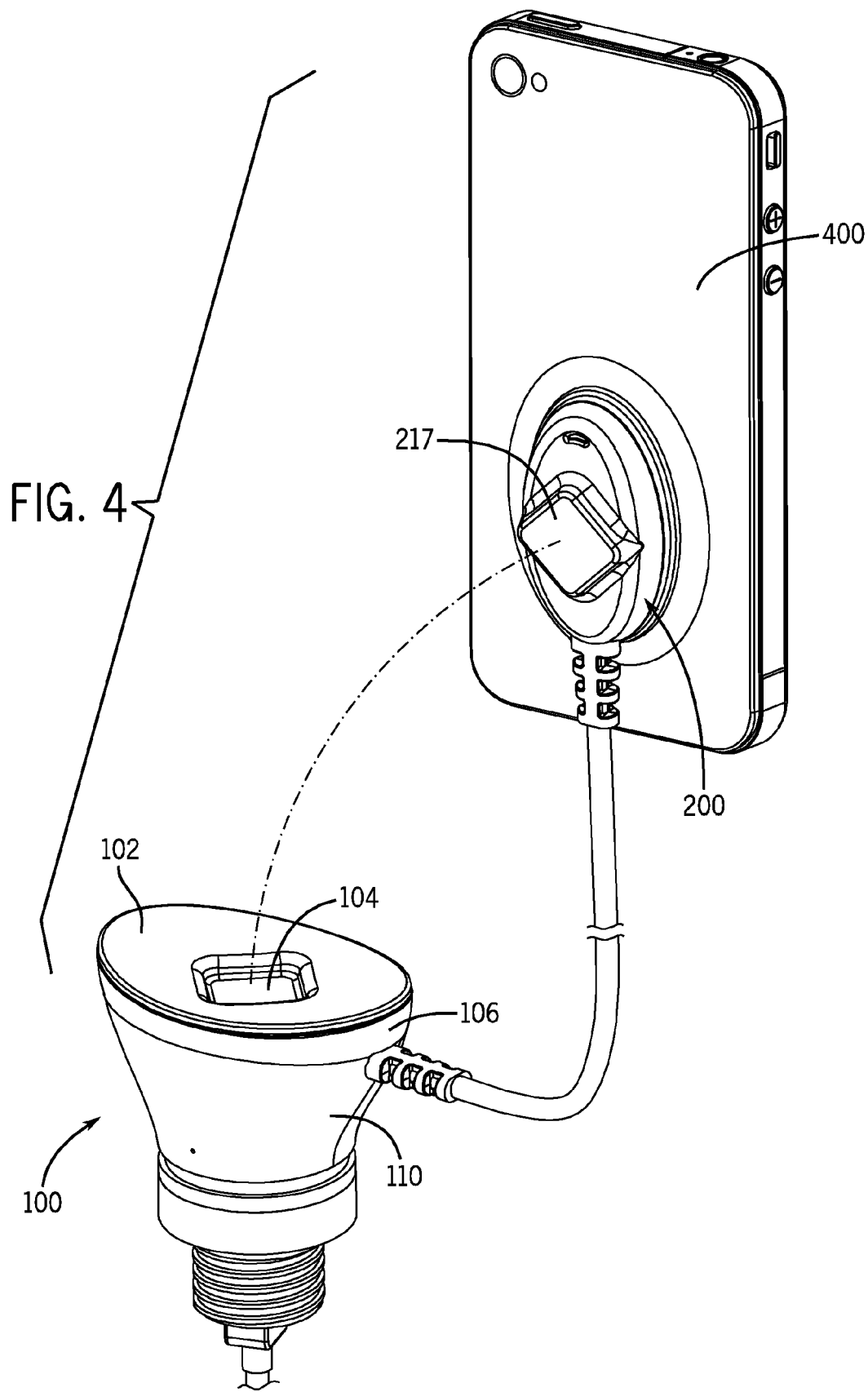
FIG. 4 is another perspective view of one base and head unit of the retail security display system of FIG. 1.
Figure 5:
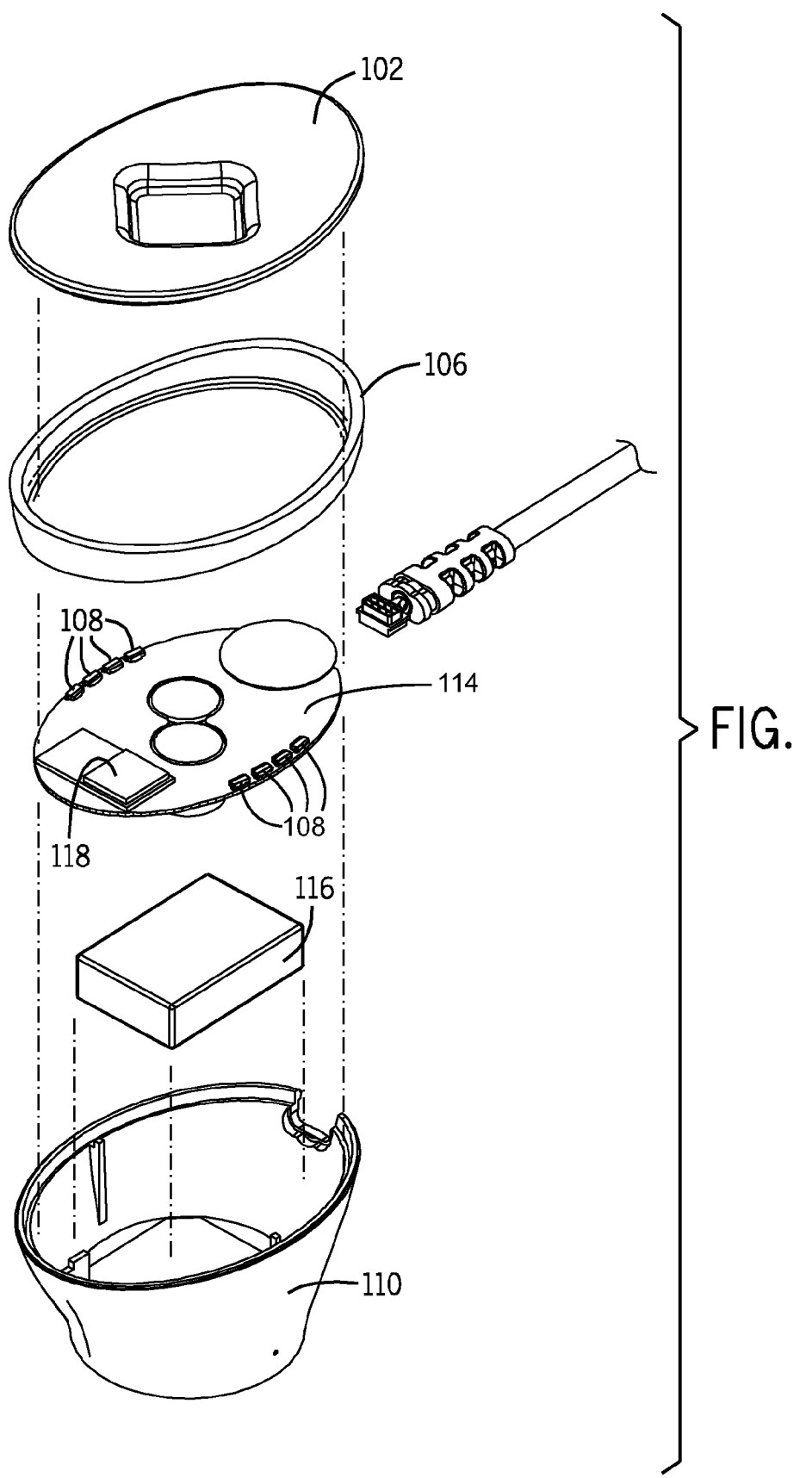
FIG. 5 is an exploded perspective view of a base unit in accordance with one embodiment of the invention.
Figure 6:
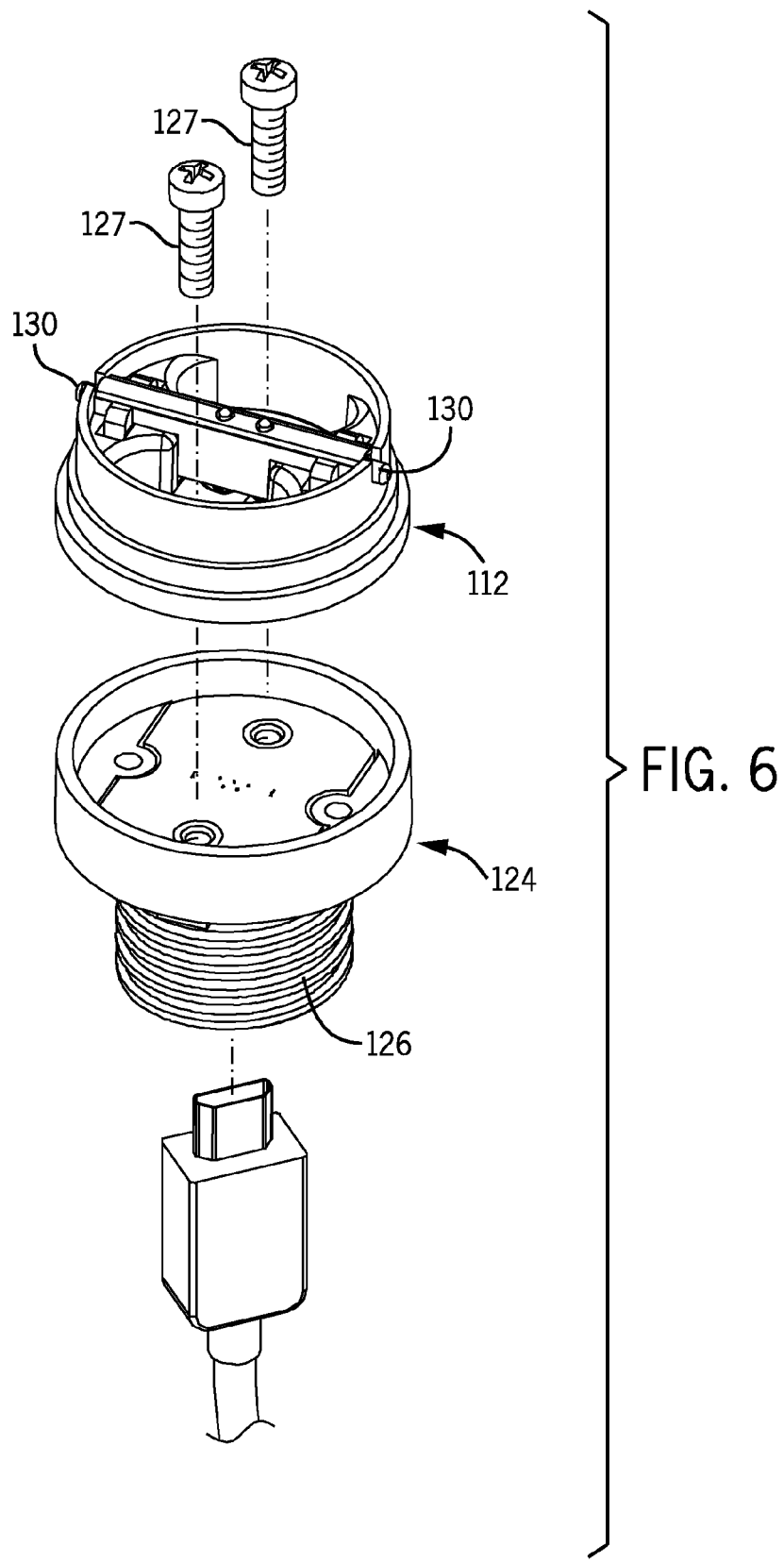
FIG. 6 is an exploded perspective view of a mounting ring and adjustment ring in accordance with one embodiment the invention.
Figure 7:
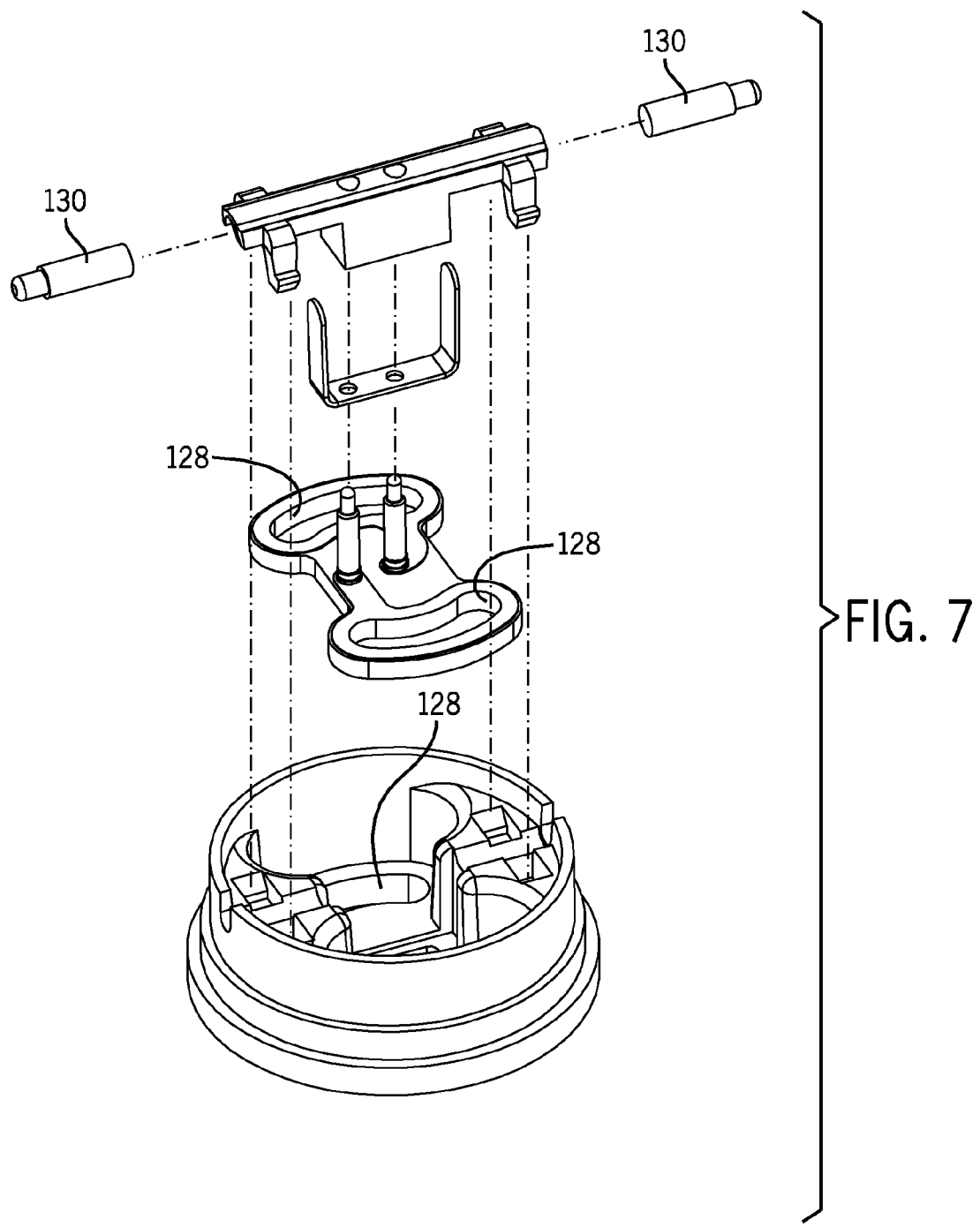
FIG. 7 is an exploded perspective view of the adjustment ring of FIG. 6.
Figure 8:
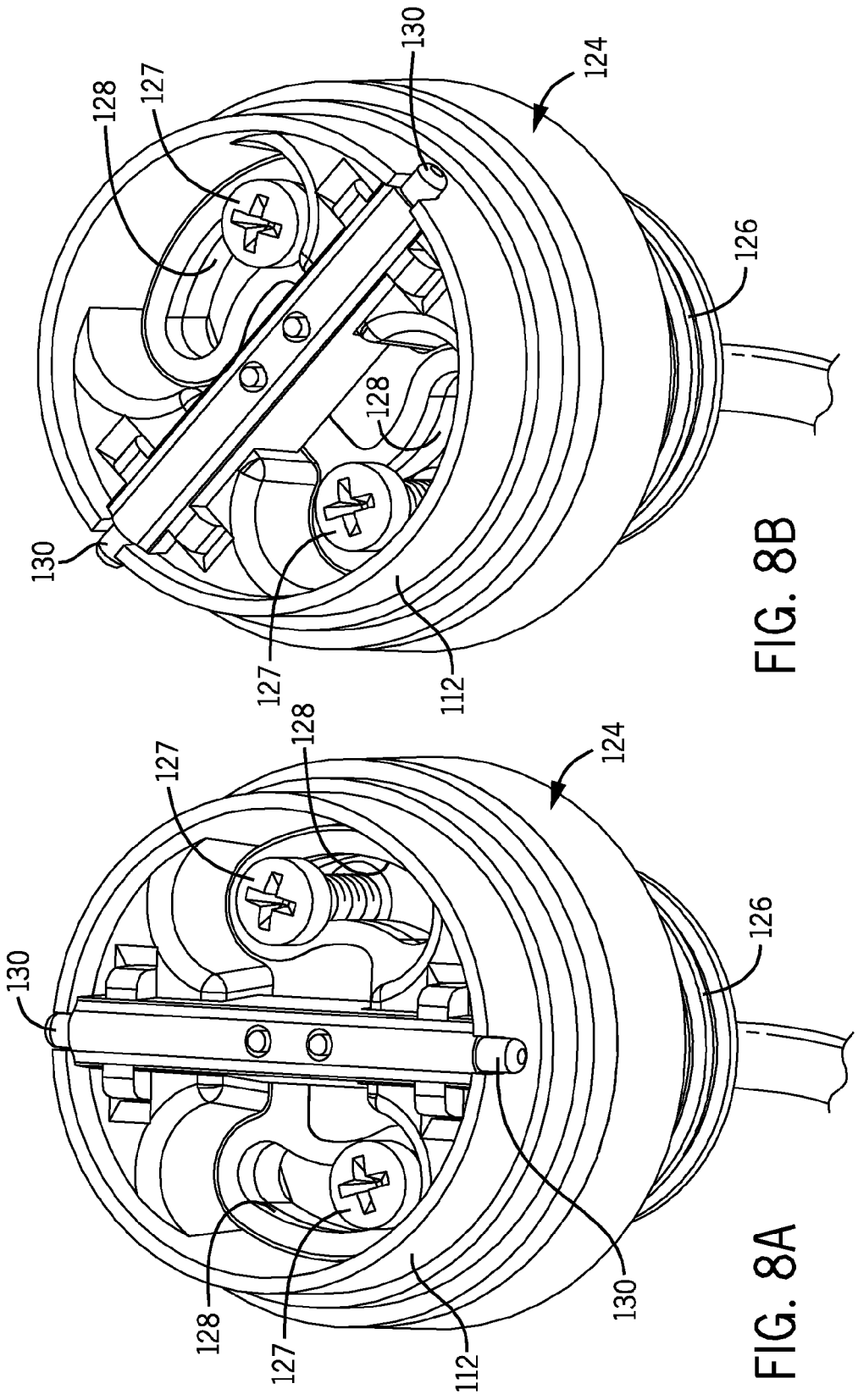
FIGS. 8A-B are perspective views of the mounting ring and adjustment ring of FIG. 6.
Figure 9:
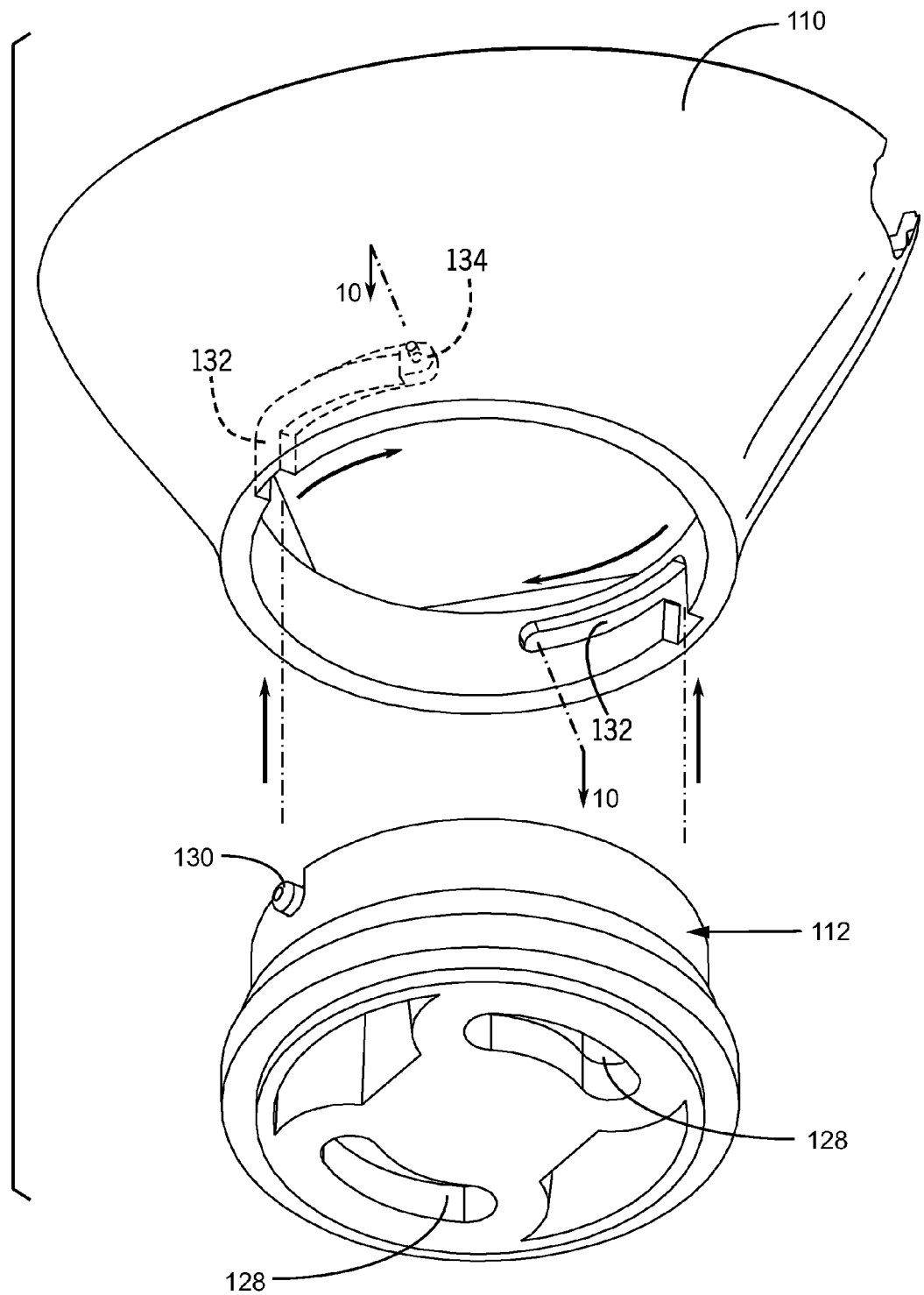
FIG. 9 is an exploded perspective view of the base unit of FIG. 5 and the adjustment ring of FIG. 6.

Turning now to FIGS. 4-5, a base unit 100 in accordance with the invention is shown. The base unit 100 is semi-permanently attached to a display surface, and includes a DC power supply that plugs into a typical wall socket. The power provided to the base unit 100 powers both the base unit and the head unit 200.

The base unit 100 supports and orients the head unit 200. In the embodiment shown, the base unit 100 includes a top cover 102 that supports, centers, and orients the head unit 200. The top cover 102 includes a geometric alignment cavity 104, which interacts with the geometrical alignment protrusion 217 of the head unit 200. Additionally, a plurality of magnets are attached to the top cover 102 such that when the head unit 200 is aligned to the base unit 100, the magnets secure the base unit and head unit to each other.

Below the top cover 102 is a light ring 106, which allows light from a plurality of LEDs 108 to emit from the base unit 100. Below the light ring 106 is a base housing 110. The base housing 110 supports the light ring 108 and top cover 102 and connects to an adjustment ring 112 (see FIGS. 6-10).

The base housing 110 includes a second PCB 114 and a battery 116. The second PCB 114 includes, a microcontroller 118, a wireless communication link, a docking sensor, a base speaker, and the plurality of LEDs 108. The battery 116 provides power to the unit in the event that power supplied from the DC power supply is lost. The microcontroller 118 communicates to the head unit 200 and to the central communication module 300. In the embodiment shown, the microcontroller 118 uses the wireless communication link 120 to communicate to the central communication module 300. In alternative embodiments, the base unit 100 may communicate to the central communication module 300 via a wired connection. The microcontroller 118 may communicate only to the head unit 200 or only to the central communication module 300 without departing from the invention. The wireless communication link 120 may be an RF link or any other type of wireless communication without departing from the invention.

In the embodiment shown, the docking sensor is integrated into the second PCB 114. The docking sensor senses when the head unit 200 is either picked-up or replaced on the base unit 100 by measuring changes in magnetic flux that occur when the magnetic attraction between the magnets in the base unit and those in the head unit are separated. Of course, other sensing means may be used to determine whether the head unit 200 is picked-up or replaced on the base unit 100 without departing from the invention. In the embodiment shown, the microcontroller 118 communicates if and when the protected device 400 is picked-up or replaced to the central communication module 300. The central communication module 300 includes software that can track such data. Such data is useful to the retail store because it can better optimize the layout of the store based on interest in certain protected devices 400. Additionally, the microcontroller 118 may track additional customer engagement information about the protected device 400. Such information may include, but is not limited to: what was accessed on the protected device 400 when it was picked-up, what keys were pressed, and/or how long the customer spent on a particular screen or performing a particular task.

The plurality of LEDs 108 illuminate to draw attention to the base unit 100, and, like the LEDs 226 previously described may also signal an alarm to store personnel. For example, if a thief attempts to steal the protected device 400, the LEDs 108 may flash, change colors, or otherwise draw attention to the base unit 100. In the embodiment shown, the LEDs 108 display a plurality of colors, but single color LEDs may be used without departing from the invention. For example, the LEDs 108 may flash red when an alarm is triggered, but display blue when the alarm is simply armed. Alternatively, the LEDs 108 may display a pattern of colors to draw a customer's attention to the protected device 400.

Turning now to FIGS. 6-10, the mounting ring 124, in cooperation with the adjustment ring 112, permits removal of the base housing 110 from the mounting ring 124. Removing the base housing 110 from the mounting ring 124 allows store personnel to re-planogram easily, without having to remove the protected device 400 from the head unit 200. Rather, store personnel simply remove the base housing 110, which is connected to the head unit 200, and the protected device 400, and move the display to another location with a mounting ring 124. The mounting ring 124 includes a threaded portion 126 and a third PCB 128 for transmitting power from the DC power supply to the adjustment ring 112, and through to the base unit 100 and head unit 200. The mounting ring 124 is semi-permanently attached to the display surface by inserting the threaded portion 126 through a hole in the display surface, and attaching a nut to the threaded portion and securing it to the underside of the display surface. In the embodiment shown, the adjustment ring 112 is then attached to the mounting ring 124 by two screws 127.

The adjustment ring 112 includes two channels 128 that allow for adjustment of the orientation of the base unit 100. An operator simply loosens the screws 127, and the adjustment ring 112 may be rotated slightly in either direction to ensure that the retail security display system 10 is in the desired orientation. Once the adjustment ring 112 is in the proper alignment, the operator tightens the screws 127 to lock the adjustment ring in place. The adjustment ring 112 further includes a plurality of spring loaded pins 130 that extend radially from the adjustment ring. The spring loaded pins 130 correspond to channels 132 in the base housing 110. To install the base housing 110 on the adjustment ring 112, an operator lowers the base housing onto the channels 132 and twists the base housing until the spring loaded pins engage a locking recess 134 at the end of one of the channels 132. The base housing 110 could be installed on the adjustment ring using alternative fastening means without departing from the invention.

The central communication module 300 is a centrally located component of the retail security display system 10. The central communication module 300 includes software and wireless communication circuitry that manages and controls information coming from and flowing to a plurality of base units 100. In the embodiment shown, the central communication module 300 is a computer and includes software that allows store employees or other personnel to access data stored on the central communication module 300 on any device with internet access. Additionally, the central communication module 300 includes a battery that provides power to the central communication module in the event of a loss of power from the DC power supply.

In other embodiments, the head unit 200 may communicate wirelessly to the base unit 100 or central communication module. In such an embodiment, the head unit 200 would not be physically tethered to the base unit 100 or the display surface. The base unit 100 and head unit 200 may include charging pins that electrically connect the base unit to the head unit when the head unit is attached to the base unit. Including charging pins to electrically connect the base unit 100 and the head unit 200 allows the battery 210 in the head unit to maintain a full charge, and allows the retail security display system 10 to power the protected device 400 while it is sitting on the base unit. Because the head unit 200 is not electrically connected to the base unit 100, the communications circuitry communicates wirelessly to the base unit 100 and/or central communication module 300. When the head unit 200 is removed from the base unit 100, the protected device 400 would use its onboard battery to power itself, and the battery 210 would be used only to power the LEDs 226 and a proximity alarm system. A proximity alarm system is used in this embodiment because the continuity between the base unit 100 and the head unit 200 is broken every time the protected device 400 is picked up from the base unit, so an alarm triggered by such a break in continuity would not work. The proximity alarm works by incorporating at least one proximity sensor in the base unit 100 and/or head unit 200 that senses when the head unit is too remote from the base unit, thereby triggering the alarm. Of course, any proximity sensor could be used without departing from the invention.

Although the invention has been herein described in what is perceived to be the most practical and preferred embodiments, it is to be understood that the invention is not intended to be limited to the specific embodiments set forth above. Rather, it is recognized that modifications may be made by one of skill in the art of the invention without departing from the spirit or intent of the invention and, therefore, the invention is to be taken as including all reasonable equivalents to the subject matter of the appended claims and the description of the invention herein.

What is claimed is:

1. A display system comprising:
a central communication module communicating with at least one retail display;
each retail display including a base unit and a head unit;
each base unit of a retail display unit semi-permanently attached to a display surface;
the base unit providing power from an external power supply to the head unit;
the base unit transmitting and receiving information to and from the central communication module and to and from the head unit;
the base unit including a housing, at least one printed circuit board, at least one battery, a first sound generation element, and at least one magnet;
the head unit permanently attached to a protected device and including a housing, at least one printed circuit board, a second sound generation element, an onboard power supply, and at least one magnet;
the head unit including a geometric protrusion that aligns with a corresponding cavity on an upper surface of the base unit;
the magnets in the head unit and base unit removably securing the head unit to the base unit when the geometric protrusion of the head unit is inserted into the cavity on the upper surface of the base unit;
the head unit communicating with the base unit by a wired connection;
the head unit further including an alarm which activates the first and second sound generation elements, the alarm circuit activated if the electrical connection between the head unit and the base unit is severed; and
the alarm on the head unit being powered by the onboard power supply and on the base unit by the at least one battery.

2. The display system of claim 1 wherein the head unit further includes a proximity sensor.

3. The display system of claim 1 wherein the head unit further includes a plurality of LEDs that emit light through a skirt.

4. The display system of claim 1 wherein the central communication module communicates with the base unit by a wireless connection.

5. The display system of claim 1 wherein the central communication module communicates with the base unit by a wired connection.

6. The display system of claim 1 wherein the protected device includes a Global Positioning System chipset and the software tracks the location of the head unit using GPS data provided by the GPS chipset.

7. The display system of claim 1 wherein the head unit includes a Global Positioning System chipset and the software tracks the location of the head unit using the GPS data provided by the GPS chipset.

8. The display system of claim 1 wherein the base unit is attached to the display surface by a mounting ring.

9. The display surface of claim 8 wherein the mounting ring includes an adjustment ring that allows a user to orient the base unit in a desired position.

10. The display system of claim 8 wherein the mounting ring is electrically connected to the adjustment ring, which is electrically connected to the base unit.

11. A display system comprising:
a central communication module communicating with at least one retail display;
each retail display including a base unit and a head unit;
the base unit providing power from an external power supply to the head unit;
the base unit transmitting and receiving information to and from the central communication module and to and from the head unit;
the base unit including a housing, at least one printed circuit board, at least one battery, a first sound generation element, and at least one magnet;
the head unit permanently attached to a protected device and including a housing, at least one printed circuit board, a second sound generation element, an onboard power supply, and at least one magnet;
the head unit including an geometric protrusion that aligns with a corresponding cavity on an upper surface of the base unit;
the magnets in the head unit and base unit removably securing the head unit to the base unit when the geometric protrusion of the head unit is inserted into the cavity on the upper surface of the base unit;
the head unit communicating wirelessly to the base unit;
the head unit further including an alarm which activates the first and second sound generation elements, the alarm circuit activated if the electrical connection between the head unit and the base unit is severed; and
the alarm on the head unit being powered by the onboard power supply and on the base unit by the at least one battery.

12. The display system of claim 11 wherein the head unit further includes a proximity sensor.

13. The display system of claim 11 wherein the head unit further includes a plurality of LEDs that emit light through a skirt.

14. The display system of claim 11 wherein the central communication module communicates with the base unit by a wireless connection.

15. The display system of claim 11 wherein the central communication module communicates with the base unit by a wired connection.

16. The display system of claim 11 wherein the protected device includes a Global Positioning System chipset and the software tracks the location of the head unit using GPS data provided by the GPS chipset.

17. The display system of claim 11 wherein the head unit includes a Global Positioning System chipset and the software tracks the location of the head unit using the GPS data provided by the GPS chipset.

18. The display system of claim 11 wherein the base unit is attached to the display surface by a mounting ring.

19. The display surface of claim 18 wherein the mounting ring includes an adjustment ring that allows a user to orient the base unit in a desired position.

20. The display system of claim 18 wherein the mounting ring is electrically connected to the adjustment ring, which is electrically connected to the base unit.

* * * * *